United States Patent
Yu

(10) Patent No.: US 11,640,009 B2
(45) Date of Patent: May 2, 2023

(54) IN-WALL FEATURE DETECTION DEVICE OF MUTUAL CAPACITIVE TECHNOLOGY

(71) Applicant: Mu-Tsan Yu, Changhua County (TW)

(72) Inventor: Mu-Tsan Yu, Changhua County (TW)

(73) Assignee: PEACEFUL THRIVING ENTERPRISE CO., LTD., Changhua County (TW)

( * ) Notice: Subject to any disclaimer, the term of this patent is extended or adjusted under 35 U.S.C. 154(b) by 133 days.

(21) Appl. No.: 17/458,005

(22) Filed: Aug. 26, 2021

(65) Prior Publication Data

US 2023/0069495 A1    Mar. 2, 2023

(51) Int. Cl.

| G01V 3/08 | (2006.01) |
|---|---|
| G01V 3/36 | (2006.01) |
| G01R 27/26 | (2006.01) |
| G01V 3/15 | (2006.01) |
| G01D 5/24 | (2006.01) |

(52) U.S. Cl.
CPC ............ *G01V 3/088* (2013.01); *G01R 27/26* (2013.01); *G01R 27/2605* (2013.01); *G01V 3/36* (2013.01); *G01D 5/24* (2013.01); *G01V 3/15* (2013.01)

(58) Field of Classification Search
CPC . G01V 3/088; G01V 3/36; G01V 3/15; G01D 5/24; G01R 27/26; G01R 27/2605
USPC ........................... 324/67, 671, 686–687, 690
See application file for complete search history.

(56) References Cited

U.S. PATENT DOCUMENTS

| 8,476,912 B2 * | 7/2013 | Dorrough | G01V 3/165 324/687 |
|---|---|---|---|
| 8,593,163 B2 * | 11/2013 | Dorrough | G01R 27/26 324/67 |
| 8,736,283 B2 * | 5/2014 | Dorrough | G01R 27/26 324/67 |
| 9,035,662 B2 * | 5/2015 | Reime | G01V 3/088 324/687 |

(Continued)

FOREIGN PATENT DOCUMENTS

| CA | 2977086 A1 * | 8/2016 | ............ G01V 3/088 |
|---|---|---|---|
| DE | 102007058088 A1 * | 6/2009 | ........... G01N 27/221 |

(Continued)

*Primary Examiner* — Jermele M Hollington
*Assistant Examiner* — Sean Curtis
(74) *Attorney, Agent, or Firm* — Che-Yang Chen; Law Office of Michael Chen

(57) ABSTRACT

An in-wall feature detection device of mutual capacitive technology comprises a housing, a detection baseplate, and at least one capacitive sensing baseplate. The detection baseplate is disposed in the housing and has a central processing module and a capacitance value conversion module and is electrically connected to at least one display module. The capacitive sensing baseplate is provided with driving modules and receiving modules, the driving and receiving modules are arranged in a crisscross manner and electrically connected to the capacitance value conversion module. The in-wall feature detection device is capable of using an electric field change between the driving and receiving modules to determine whether there is a blocking object in a wall, and further generating a corresponding light signal through the central processing module to display a shape of the blocking object. Thereby determining a position and the shape of the blocking object during construction.

10 Claims, 12 Drawing Sheets

(56) References Cited

U.S. PATENT DOCUMENTS

| | | | |
|---|---|---|---|
| 9,429,672 B2* | 8/2016 | Zibold | G01V 3/02 |
| 10,261,208 B2* | 4/2019 | Dorrough | G01V 3/15 |
| 10,436,733 B2* | 10/2019 | Meyer | G01R 27/2605 |
| 10,613,243 B2* | 4/2020 | Dorrough | G01V 3/08 |
| 10,663,613 B2* | 5/2020 | Dorrough | G01V 3/081 |
| 10,895,657 B2* | 1/2021 | Dorrough | G01V 3/088 |
| 2011/0095771 A1* | 4/2011 | Reime | G01V 3/088 324/686 |
| 2011/0215814 A1* | 9/2011 | Dorrough | G01V 3/08 324/663 |
| 2011/0215815 A1* | 9/2011 | Dorrough | G01R 27/26 324/663 |
| 2011/0215816 A1* | 9/2011 | Dorrough | G01R 27/2605 324/663 |
| 2011/0215817 A1* | 9/2011 | Dorrough | G01N 27/22 324/663 |
| 2011/0215818 A1* | 9/2011 | Dorrough | G01V 3/08 324/679 |
| 2011/0215819 A1* | 9/2011 | Dorrough | G01V 3/15 324/684 |
| 2011/0215822 A1* | 9/2011 | Dorrough | G01R 27/26 324/687 |
| 2014/0239981 A1* | 8/2014 | Zibold | G01R 27/2605 324/680 |
| 2015/0015278 A1* | 1/2015 | Dorrough | G01V 3/15 324/663 |
| 2016/0377758 A1* | 12/2016 | Dorrough | G01V 3/15 324/672 |
| 2017/0261459 A1* | 9/2017 | Meyer | G06F 3/0446 |
| 2018/0203149 A1* | 7/2018 | Dorrough | G01V 3/088 |
| 2018/0313968 A1* | 11/2018 | Dorrough | G01V 3/165 |
| 2019/0219721 A1* | 7/2019 | Dorrough | G01V 3/081 |
| 2020/0256817 A1* | 8/2020 | Dorrough | G01R 27/2605 |
| 2023/0069495 A1* | 3/2023 | Yu | G01V 3/36 |

FOREIGN PATENT DOCUMENTS

| | | | | |
|---|---|---|---|---|
| DE | 102011079704 A1 * | 1/2013 | | G01R 27/2605 |
| DE | 102015202880 A1 * | 8/2016 | | G01V 3/088 |
| EP | 3112908 B1 * | 1/2023 | | G01N 27/221 |
| WO | WO-2011109736 A2 * | 9/2011 | | G01N 27/22 |
| WO | WO-2020191235 A1 * | 9/2020 | | G01N 27/24 |

* cited by examiner

IN-WALL FEATURE DETECTION DEVICE OF MUTUAL CAPACITIVE TECHNOLOGY

BACKGROUND OF THE INVENTION

Field of Invention

The invention relates to an in-wall feature detection device, and more particularly to an in-wall feature detection device of mutual capacitive technology capable of improving a detection resolution and distinctly detecting and displaying a shape of a blocking object in a wall, so as to quickly determining a position and the shape of the blocking object during construction.

Related Art

At present, in the decoration or maintenance of building, it is usually required to cut or drill the wooden wall, but during the construction process, it is not possible to clearly know whether there are objects such as wood stud or pipe in the wall, even if it is possible to clearly know that there are objects such as wood stud or pipe in the wall, it is impossible to clearly know the positions at which the objects are located, which will cause the work of the construction workers to be affected by the objects such as wood stud or pipe during cutting or drilling. Therefore, some manufacturers have introduced wall detectors to determine whether there are objects in the wall, and the current method commonly used in wall detectors for detecting wood studs in the wall is the capacitive technology, which mainly uses a single set of capacitive detector or two sets of capacitive detectors and the capacitive charging and discharging method to detect the positions of wood studs in the decorative wall. For example, U.S. Pat. No. 8,476,912B2 discloses a fuzzy feature detector and method, which mainly senses the features of an object through the change of the capacitance of a single electrode. It can be known from its specification and FIG. 2 and FIG. 3 that it is a self-capacitive technology, which uses the capacitive change of the single electrode to determine the position of the object in the wall, but in actual operation, the capacitive change of the single electrode can only roughly determine the position of the object, and cannot clearly determine the shape and size of the object. For example, when two locking elements are locked at different positions in the wall and crisscross each other, the self-capacitive technology will misjudge the two locking elements and the area around them as one long column as a whole. As a result, it will limit the space that the construction workers can work on, and it is impossible to accurately determine in positions where accurate construction is required, which will increase the difficulty of construction and relatively make the fuzzy feature detector lose the effect of detecting the features in the wall.

Therefore, the inventor of the invention and relevant manufacturers engaged in this industry are eager to research and make improvement to solve the above-mentioned problems and drawbacks in the prior art.

SUMMARY OF THE INVENTION

Therefore, in order to effectively solve the above-mentioned problems, a main object of the invention is to provide an in-wall feature detection device of mutual capacitive technology capable of improving a detection resolution and distinctly detecting and displaying a shape of a blocking object in a wall, so as to quickly determining a position and the shape of the blocking object during construction.

In order to achieve the above-mentioned object, the invention provides an in-wall feature detection device of mutual capacitive technology comprising a housing, a detection baseplate, and at least one capacitive sensing baseplate, wherein the housing is provided with a switch and a power supply module, the detection baseplate and the capacitive sensing baseplate are disposed in the housing, the detection baseplate is electrically connected to the switch and the power supply module and is provided with a central processing module and a capacitance value conversion module, and the detection baseplate is electrically connected to at least one display module. The capacitive sensing baseplate is provided with a plurality of driving modules and a plurality of receiving modules, and the driving modules and the receiving modules are arranged in a crisscross manner and are electrically connected to the capacitance value conversion module. The capacitance value conversion module generates at least one driving signal to be sequentially transmitted to each of the driving modules, each of the driving modules generates at least one induced electric field after being driven and sequentially transmits the at least one induced electric field to each of the receiving modules, each of the receiving modules receives the induced electric field and generates a capacitance value, the capacitance value conversion module sequentially receives the capacitance values and generates at least one capacitance value sensing signal to the central processing module when the received capacitance value changes, and the central processing module generates at least one display signal to the display module according to the capacitance value sensing signal. Thereby, the in-wall feature detection device is capable of using an electric field change between the driving modules and the receiving modules to determine whether there is a blocking object in a wall, and further generating a corresponding light signal through the central processing module to display a shape of the blocking object, thereby achieving efficacies of improving a detection resolution and distinctly detecting and displaying the shape of the blocking object in the wall, so as to quickly determining the position and the shape of the blocking object during construction.

According to one embodiment of the in-wall feature detection device of mutual capacitive technology of the invention, wherein the driving modules and the receiving modules are disposed on a single capacitive sensing baseplate.

According to one embodiment of the in-wall feature detection device of mutual capacitive technology of the invention, wherein the driving modules and the receiving modules are disposed on different capacitive sensing baseplates.

According to one embodiment of the in-wall feature detection device of mutual capacitive technology of the invention, wherein the display module is disposed on the housing.

According to one embodiment of the in-wall feature detection device of mutual capacitive technology of the invention, wherein the driving module generates the induced electric field to the receiving module after being driven, the capacitance value of the induced electric field between the driving module and the receiving module is changed by at least one blocking object, so that the capacitance value conversion module generates the capacitance value sensing signal to the central processing module, and the central processing module is capable of determining a size and a shape of the blocking object through the capacitance value sensing signal.

According to one embodiment of the in-wall feature detection device of mutual capacitive technology of the invention, wherein the display module is an LCD, the display module is formed with a plurality of shape display areas and a plurality of direction display areas, and the central processing module activates the shape display areas to generate an object indicating light source via the display signal, and can also activate the direction display areas to generate an object direction indicating light source via the display signal.

According to one embodiment of the in-wall feature detection device of mutual capacitive technology of the invention, wherein the display module comprises at least one horizontal array LED and one vertical array LED, the central processing module activates the horizontal array LED and the vertical array LED via the display signal, and the central processing module determines a center position of the blocking object through the capacitance value sensing signal and activates the corresponding horizontal array LED and vertical array LED to generate a flickering light source.

According to one embodiment of the in-wall feature detection device of mutual capacitive technology of the invention, wherein the capacitive sensing baseplate is further provided with a driving multiplexing module, wherein the driving multiplexing module is electrically connected to the central processing module and the capacitance value conversion module, and the driving modules are electrically connected to the capacitance value conversion module via the driving multiplexing module.

According to one embodiment of the in-wall feature detection device of mutual capacitive technology of the invention, wherein the capacitance value conversion module sequentially transmits the driving signals to each of the driving modules through the driving multiplexing module, each of the driving modules generates the induced electric field to be sequentially transmitted to each of the receiving modules, and each of the receiving modules receives the induced electric field and generates the capacitance value.

According to one embodiment of the in-wall feature detection device of mutual capacitive technology of the invention, wherein the capacitive sensing baseplate is further provided with a receiving multiplexing module electrically connected to the capacitance value conversion module, the receiving modules are electrically connected to the capacitance value conversion module via the receiving multiplexing module, and the capacitance value conversion module sequentially receives the capacitance values through the receiving multiplexing module.

DETAILED DESCRIPTION OF THE INVENTION

The above object of the invention, as well as its structural and functional features, will be described in accordance with the preferred embodiments of the accompanying drawings.

Figure 1:
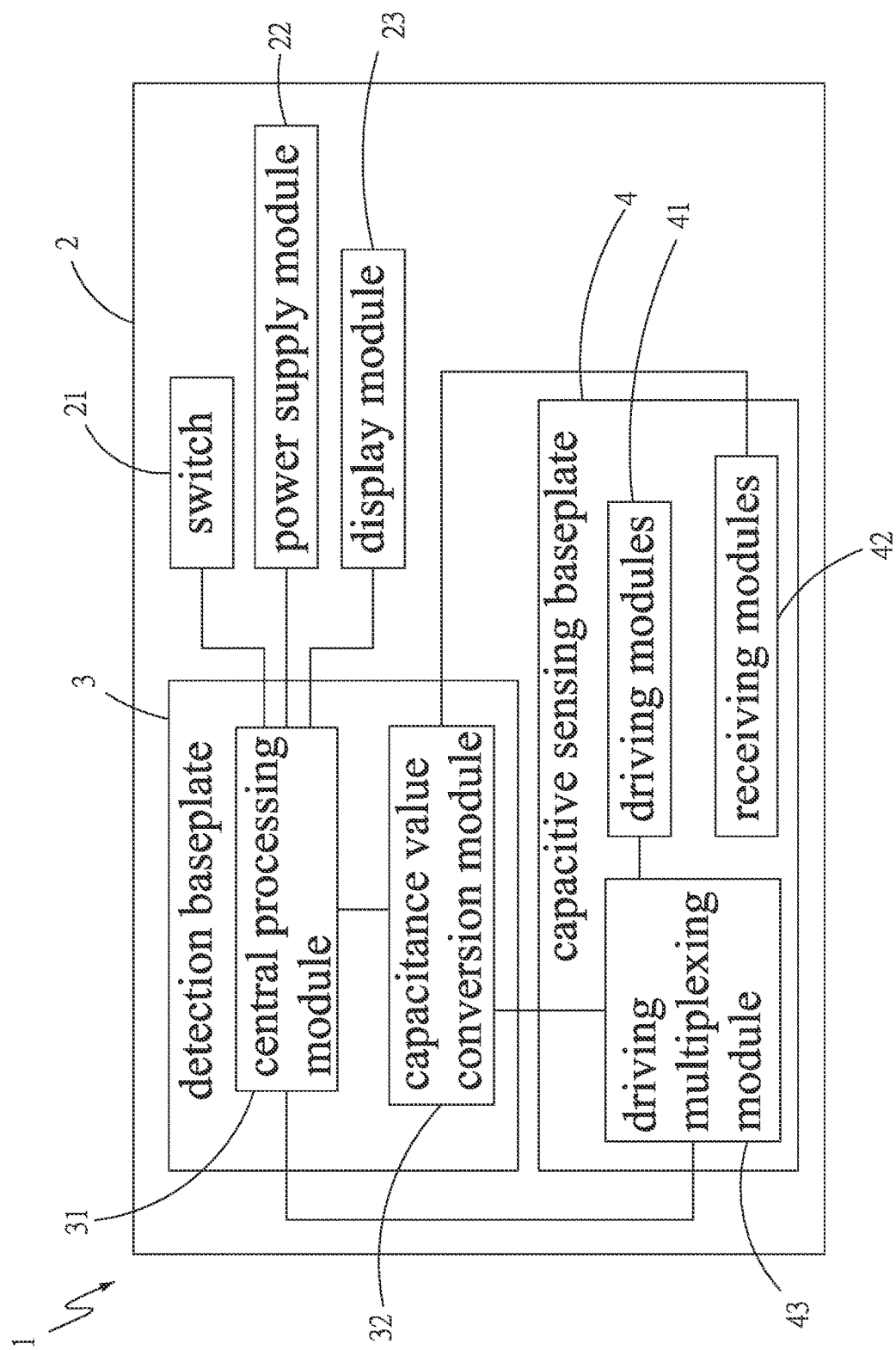
FIG. 1 is a block diagram of an in-wall feature detection device of mutual capacitive technology of the invention.
Figure 2A:
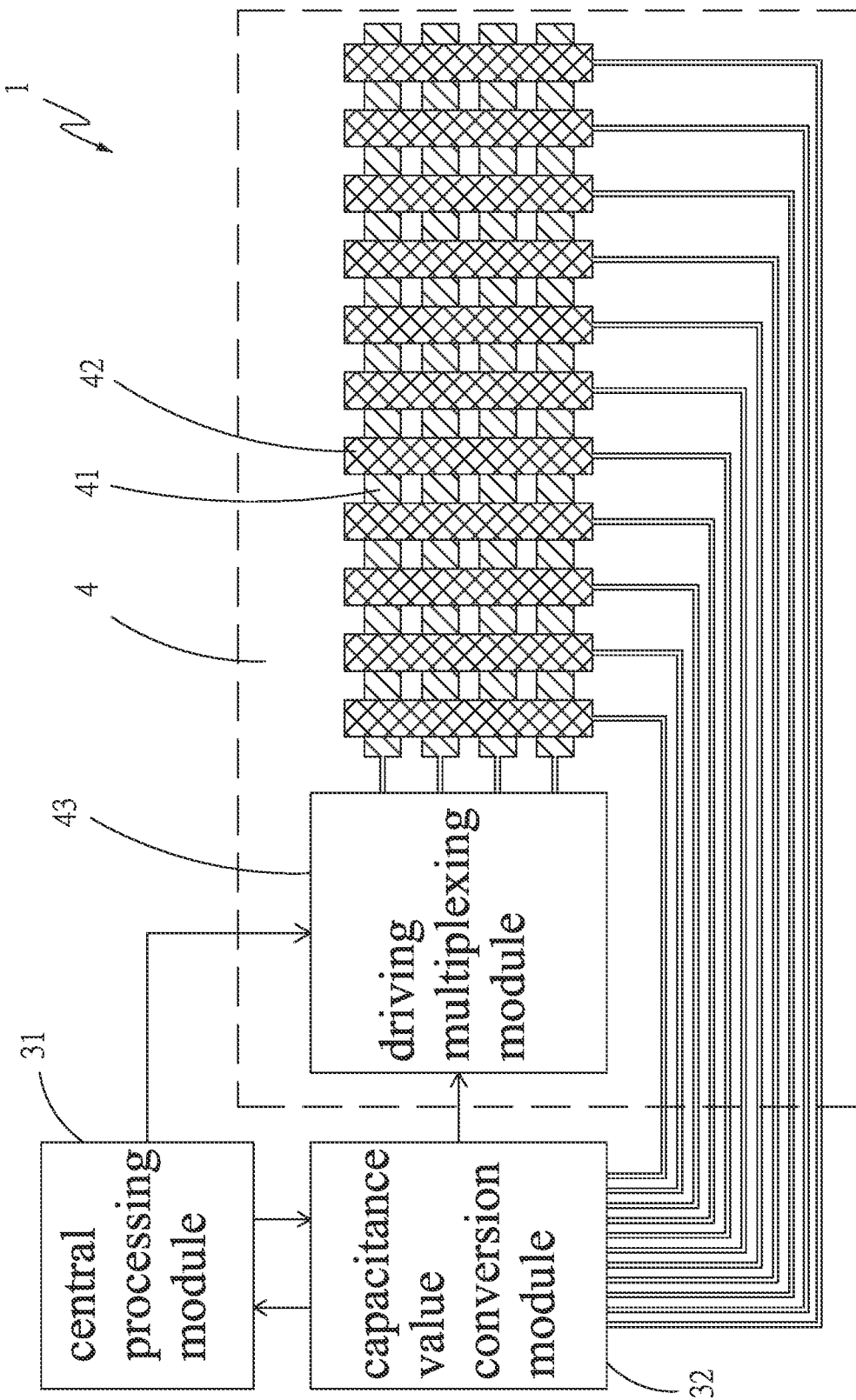
FIG. 2A is a partial schematic diagram of the in-wall feature detection device of mutual capacitive technology of the invention.
Figure 2B:
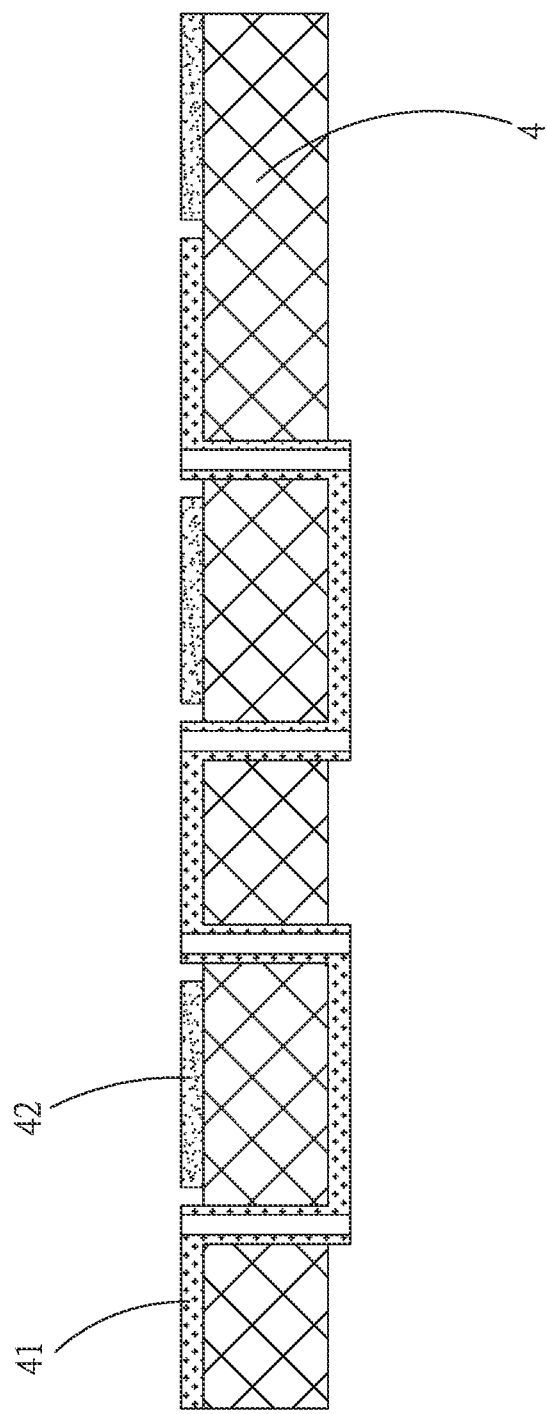
FIG. 2B is a first partial cross-sectional view of the in-wall feature detection device of mutual capacitive technology of the invention.
Figure 2C:
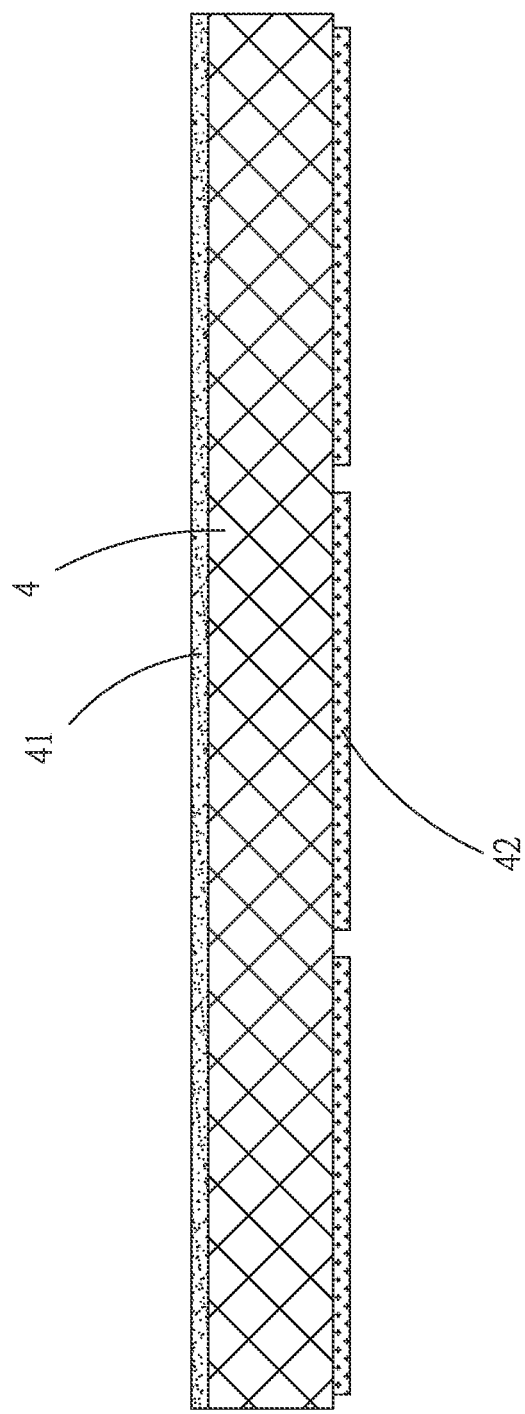
FIG. 2C is a second partial cross-sectional view of the in-wall feature detection device of mutual capacitive technology of the invention.
Figure 3:
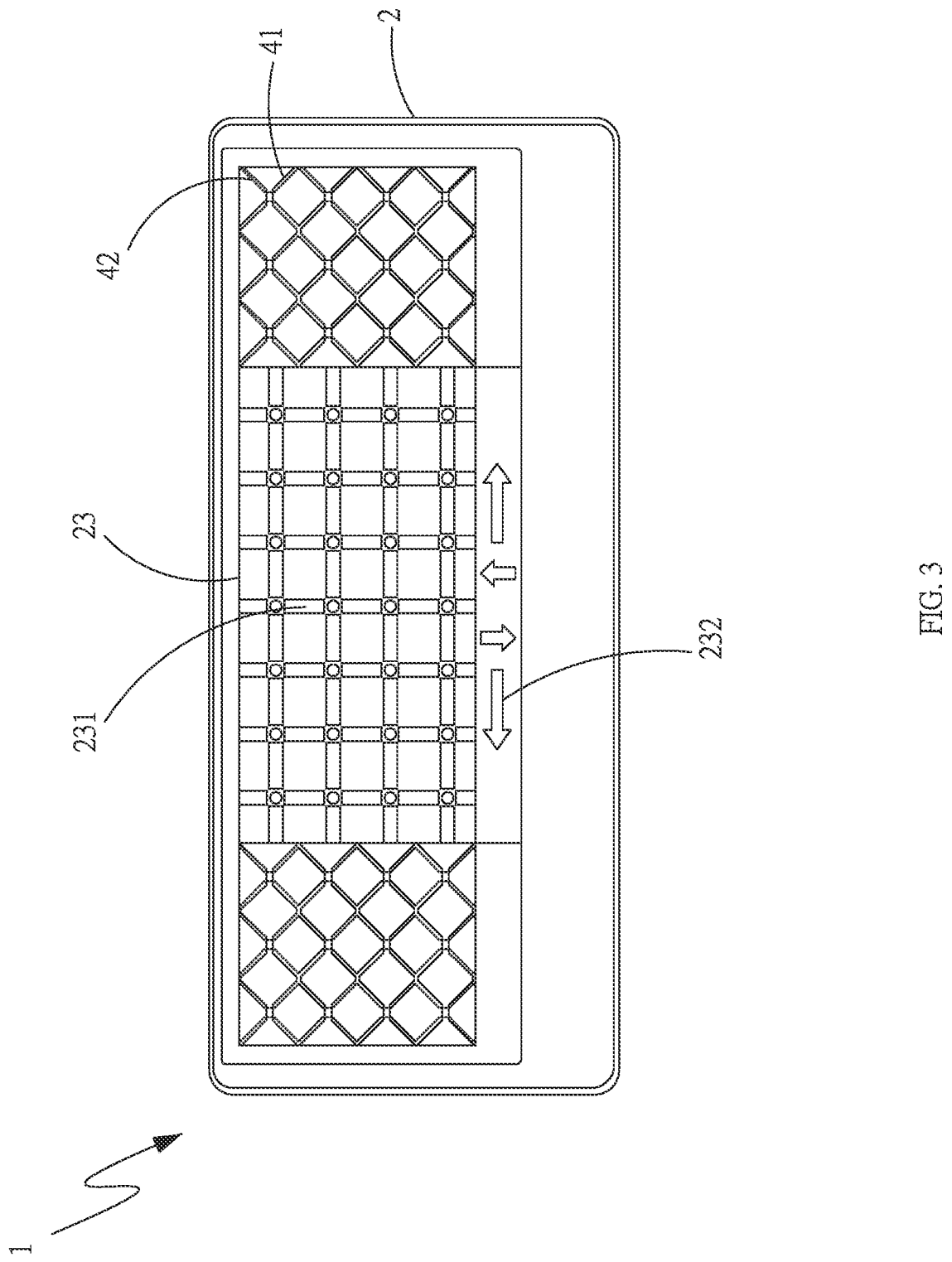
FIG. 3 is a schematic diagram of the in-wall feature detection device of mutual capacitive technology of the invention.

First of all, please refer to FIGS. 1 to 3 respectively for a block diagram, a partial schematic diagram, a first partial cross-sectional view, a second partial cross-sectional view, and a schematic diagram of an in-wall feature detection device of mutual capacitive technology of the invention. It can be clearly seen from the figures that an in-wall feature detection device 1 comprises a housing 2, a detection baseplate 3, and at least one capacitive sensing baseplate 4.

Wherein the housing 2 is provided with a switch 21 thereon, the housing 2 is provided with a power supply module 22 therein, the switch 21 and the power supply module 22 are electrically connected to the detection baseplate 3, and the housing 2 is provided with at least one display module 23 thereon, and the display module 23 can be an LCD or an LED. In this embodiment, the display module 23 is disposed on the housing 2 as an LCD module, and the display module 23 is formed with a plurality of shape display areas 231 and a plurality of direction display areas 232.

Wherein the detection baseplate 3 is disposed in the housing 2, the detection baseplate 3 is provided with a central processing module 31 and a capacitance value conversion module 32, and the detection baseplate 3 is electrically connected to the display module 23.

Wherein the capacitive sensing baseplate 4 is disposed in the housing 2, the capacitive sensing baseplate 4 is electrically connected to the capacitance value conversion module 32, and the capacitive sensing baseplate 4 is provided with a plurality of driving modules 41, a plurality of receiving modules 42, and a driving multiplexing module 43. Alternatively, the capacitance value conversion module 32 is placed on the capacitive sensing baseplate 4, and a material of the capacitive sensing baseplate 4 can be a single multi-layer PCB board, a single PET film or multiple PET films, or a flexible circuit board, and the capacitive sensing baseplate 4 is electrically connected to the detection baseplate 3.

Alternatively, the capacitance value conversion module 32 and the driving multiplexing module 43 can be directly placed on the flexible circuit board and electrically connected to the detection baseplate 3 by a connector. In addition, wherein the driving modules 41 can be disposed in a horizontal array on the capacitive sensing baseplate 4, and the receiving modules 42 are disposed in a vertical array on the capacitive sensing baseplate 4. Alternatively, the driving modules 41 can be disposed in a vertical array on the capacitive sensing baseplate 4, and the receiving modules 42 are disposed in a horizontal array on the capacitive sensing baseplate 4, the driving modules 41 and the receiving modules 42 crisscross one another, and the driving modules 41 and the receiving modules 42 are disposed on the capacitive sensing baseplate 4 in a manner that do not contact one another and electrically connected to the capacitance value conversion module 32. In this embodiment, the driving modules 41 and the receiving modules 42 are arranged to fill in a space in the housing 2, the driving multiplexing module 43 is electrically connected to the central processing module 31 and the capacitance value conversion module 32, and the driving modules 41 are electrically connected to the capacitance value conversion module 32 via the driving multiplexing module 43.

Wherein the driving modules 41 and the receiving modules 42 on the capacitive sensing baseplate 4 can be disposed in the following two modes. The first mode is as shown in FIGS. 2B and 2C: the driving modules 41 and the receiving modules 42 are disposed on the same capacitive sensing baseplate 4. For example, the driving modules 41 and the receiving modules 42 are disposed on upper and lower sides of the capacitive sensing baseplate 4 formed by a PCB board or disposed on the same side of the PCB board, but when being disposed on the same side of the PCB board, the PCB board uses through holes to crisscross connect the driving modules 41 and the receiving modules 42 in a circuit connection mode. The second mode: the driving modules 41 and the receiving modules 42 are disposed on the different capacitive sensing baseplates 4. For example, the driving modules 41 and the receiving modules 42 are respectively disposed on the capacitive sensing baseplates 4 formed by different flexible boards, and the two flexible boards are combined in a stacked structure, so that electrodes of the driving modules 41 and the receiving modules 42 are not in contact with one another, and a parasitic capacitance can be generated between interleaving.

Wherein the driving modules 41 are driving electrodes, the receiving modules 42 are sensing electrodes, and the driving modules 41 and the receiving modules 42 are disposed on the capacitive sensing baseplate 4 and crisscross one another but do not contact with one another. Thereby, when the in-wall feature detection device 1 is in use, changes in a capacitance value between the two electrodes are sensed to determine a position, a size and a shape of an object. Take FIG. 2A as an example for illustration: when the in-wall feature detection device 1 is in use, a parasitic capacitance is generated at an intersection between the driving electrode and the sensing electrode, if the parasitic capacitance value changes, it can be determined that there is an object at the intersection between the electrodes, and then the position, size and shape of the object can be precisely determined when the parasitic capacitance value changes at the intersections of the electrodes, respectively.

Figure 4:
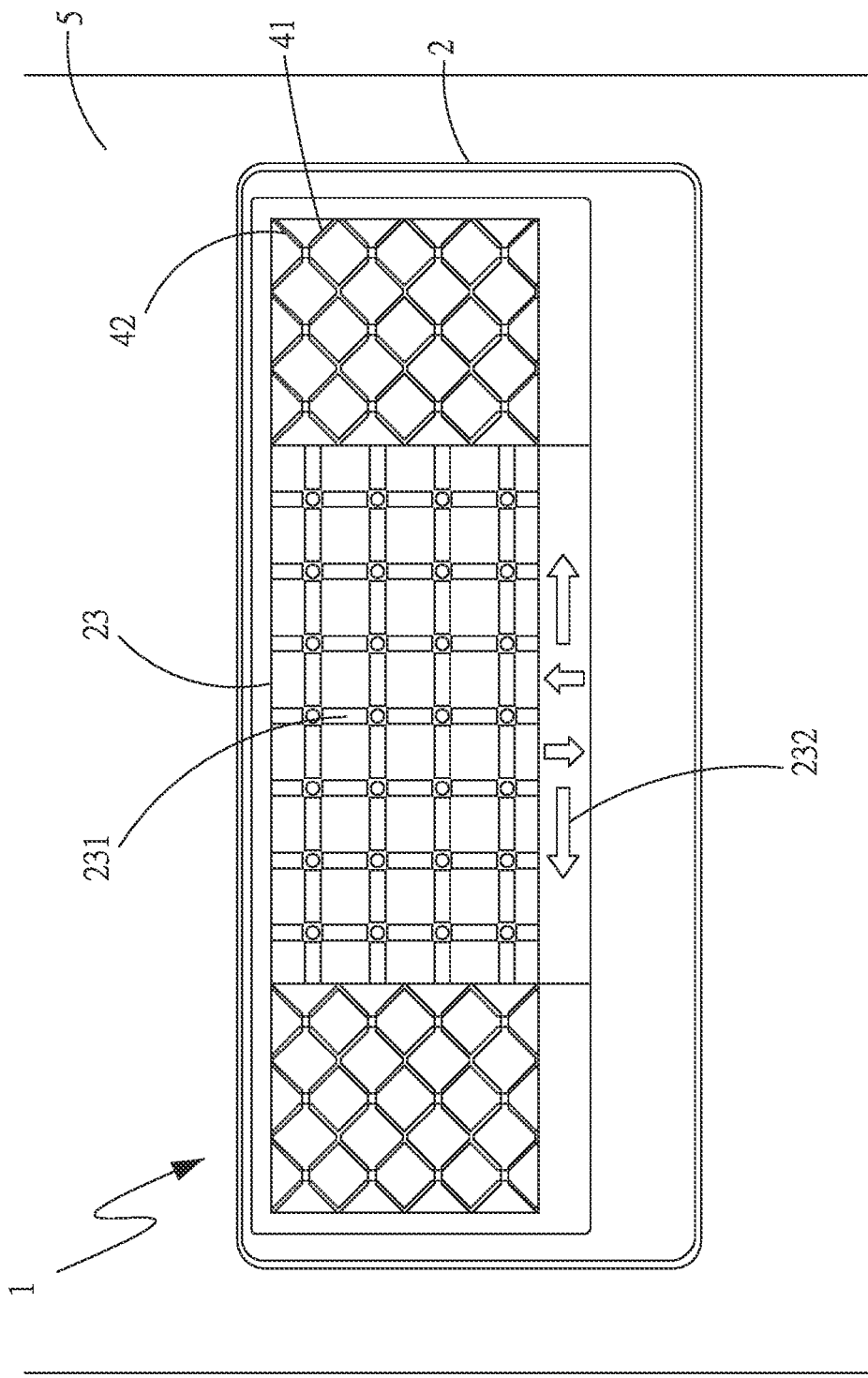
FIG. 4 is a first schematic diagram of implementation of the in-wall feature detection device of mutual capacitive technology of the invention.
Figure 5:
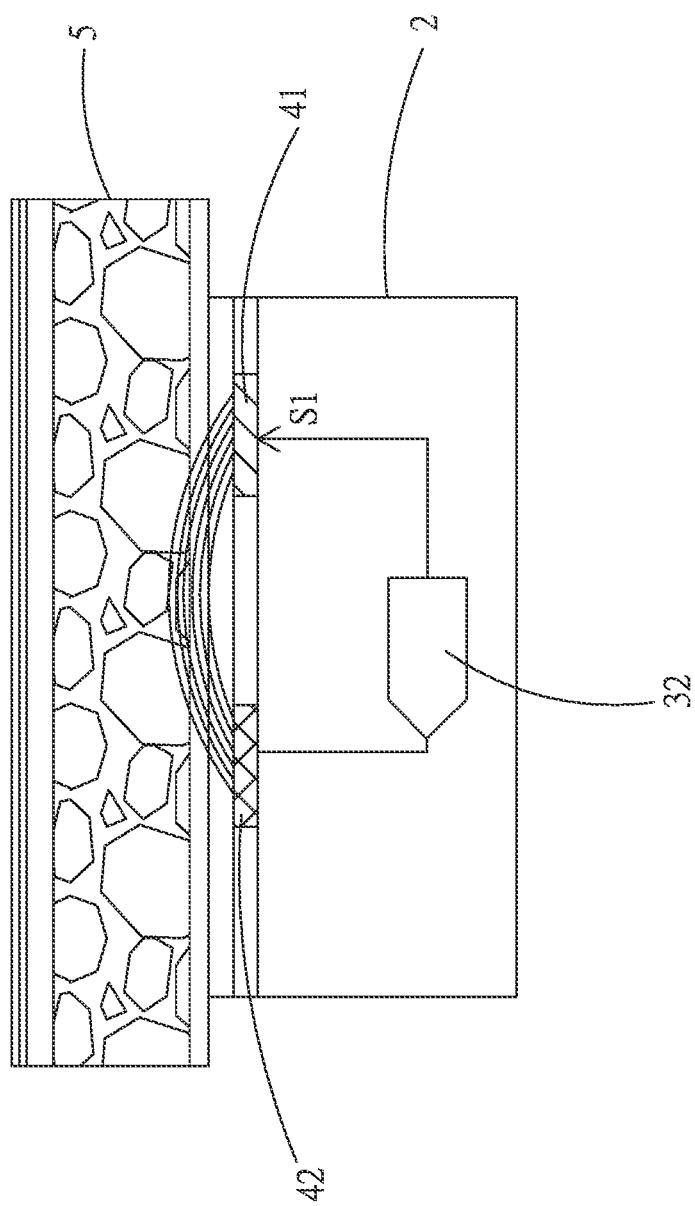
FIG. 5 is a second schematic diagram of implementation of the in-wall feature detection device of mutual capacitive technology of the invention.

Please refer to the aforementioned figures as well as FIGS. 4 and 5 respectively for a first schematic diagram of implementation and a second schematic diagram of implementation of the in-wall feature detection device of mutual capacitive technology of the invention, wherein when the in-wall feature detection device 1 is in use, the switch 21 can be switched on and the in-wall feature detection device 1 is attached to a wall surface 5, the power supply module 22 supplies electric power to the detection baseplate 3 and the capacitive sensing baseplate 4, the central processing module 31 generates at least one activation signal and at least one control signal, and the activation signal and the control signal of the central processing module 31 can be transmitted to the capacitance value conversion module 32 at the same time. Alternatively, the central processing module 31 transmits the activation signal to the capacitance value conversion module 32, and transmits the control signal to the driving multiplexing module 43. The capacitance value conversion module 32 generates at least one driving signal S1 after receiving the activation signal, and after receiving the control signal, the driving signals S1 are sequentially transmitted to each of the driving modules 41, respectively. After each of the driving modules 41 is driven by the driving signal S1, at least one induced electric field is generated to be sequentially transmitted to each of the receiving modules 42, each of the receiving modules 42 receives the induced electric field and generates a capacitance value, and the capacitance value conversion module 32 sequentially receives the capacitance values. Wherein when a detection position of the in-wall feature detection device 1 on the wall surface 5 does not have a blocking object 51, an induced electric field between the driving module 41 and the receiving module 42 will not be affected, so the capacitance value received by the capacitance value conversion module 32 is equivalent to the induced electric field generated by the driving module 41. Therefore, a capacitance value sensing signal generated by the capacitance value conversion module 32 is normal, and the display module 23 on the housing 2 does not generate a light source.

Figure 6:
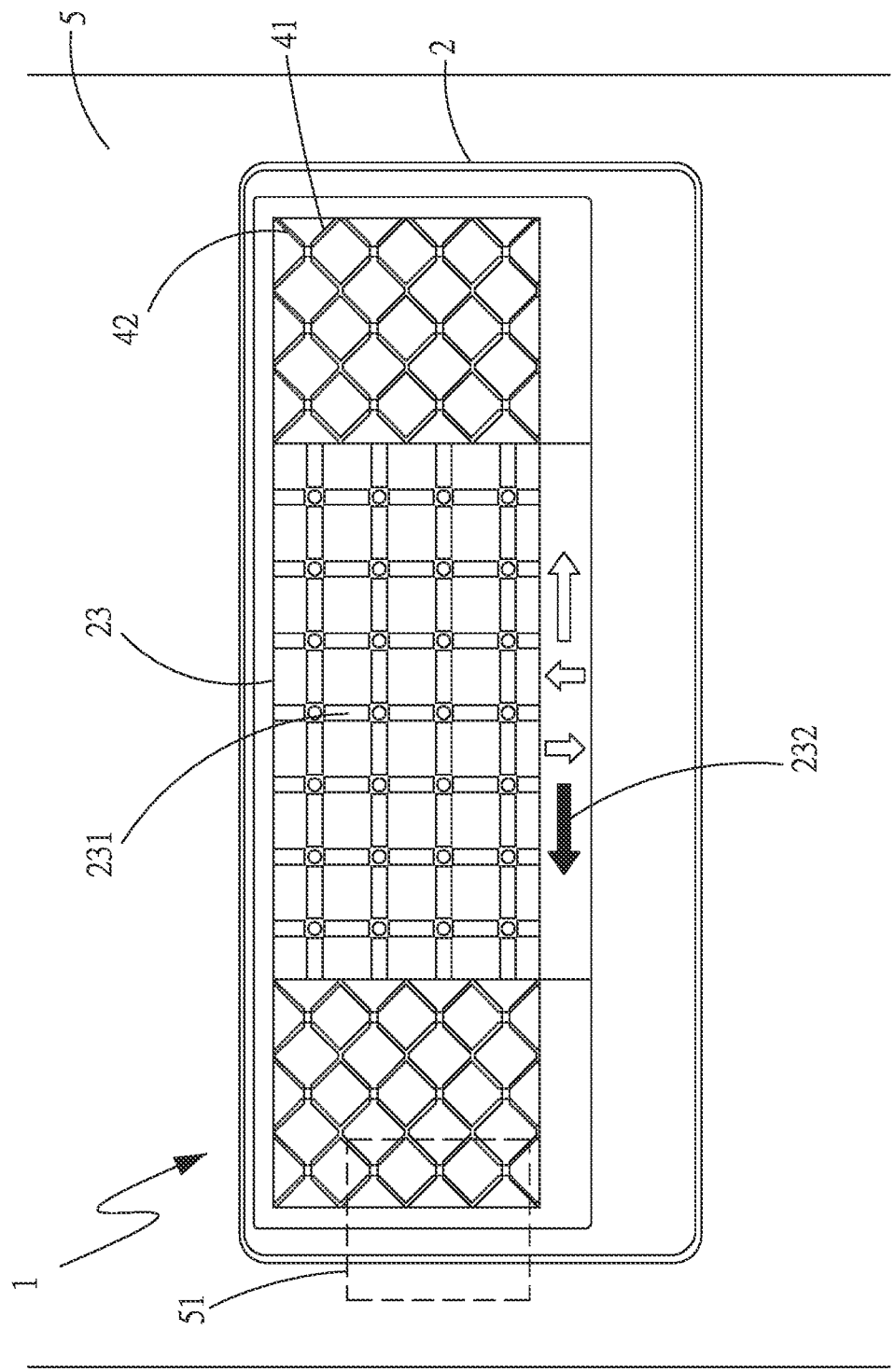
FIG. 6 is a third schematic diagram of implementation of the in-wall feature detection device of mutual capacitive technology of the invention.
Figure 7:
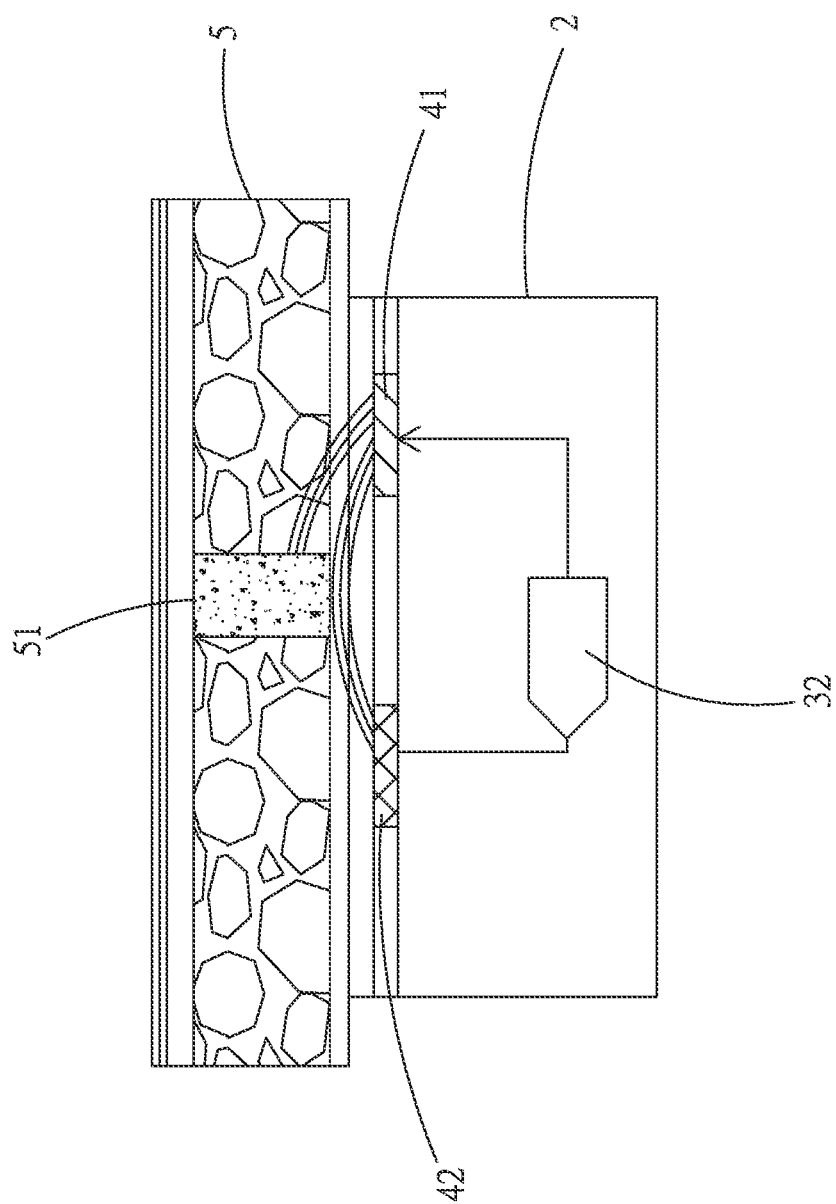
FIG. 7 is a fourth schematic diagram of implementation of the in-wall feature detection device of mutual capacitive technology of the invention.
Figure 8:
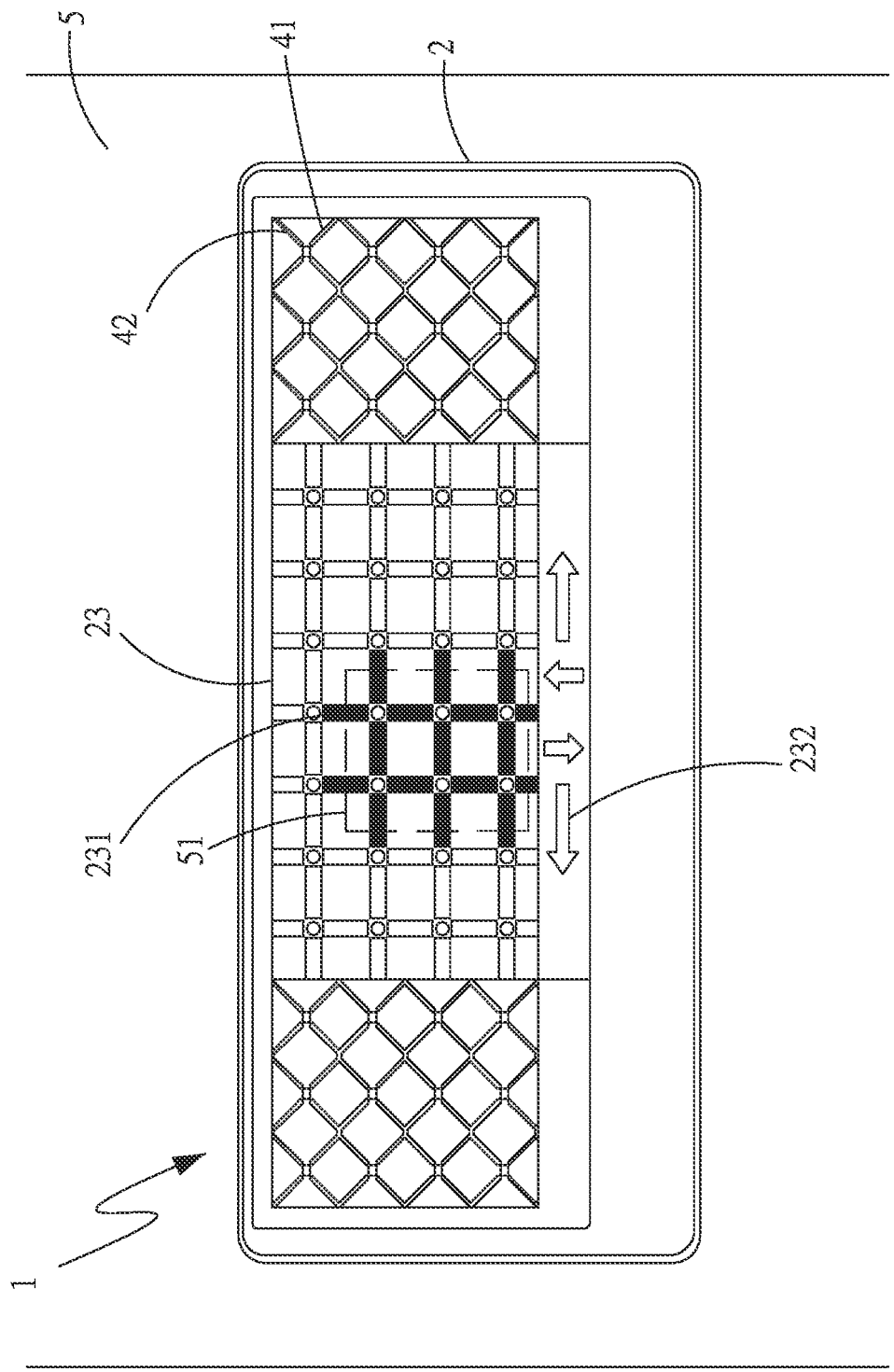
FIG. 8 is a fifth schematic diagram of implementation of the in-wall feature detection device of mutual capacitive technology of the invention.

Please refer to the aforementioned figures as well as FIGS. 6 to 8 respectively for a third schematic diagram of implementation, a fourth schematic diagram of implementation, and a fifth schematic diagram of implementation of the in-wall feature detection device of mutual capacitive technology of the invention, wherein the capacitance value conversion module 32 continuously generates the driving signals S1 to be sequentially transmitted to each of the driving modules 41 via the driving multiplexing module 43, and each of the driving modules 41 continuously generates an induced electric field to each of the receiving modules 42. The in-wall feature detection device 1 is moved on the wall surface 5, when the in-wall feature detection device 1 moves to a position where the blocking object 51 such as a wood stud or a pipe is located behind the wall surface 5, the induced electric field generated by the driving module 41 will be affected by the blocking object 51, causing a change in the capacitance value sensed by the receiving module 42. And because the driving modules 41 and the receiving modules 42 are arranged to fill in the space in the housing 2 by disposing in a horizontal array and a vertical array, the capacitance values between the driving modules 41 and the receiving modules 42 represent their respective coordinate positions on the housing 2. The capacitance value conversion module 32 sequentially receives the capacitance values, when the capacitance value received by the capacitance value conversion module 32 changes, the capacitance value sensing signal is generated to the central processing module 31, and the central processing module 31 generates at least one display signal to the display module 23 at a relative coordinate position according to the capacitance value sensing signal.

In this embodiment, a position of the blocking object 51 is in an area left of the display module 23, and the capacitance value sensing signal received by the central processing module 31 via the capacitance value conversion module 32 is located in an area left of the display module 23, wherein the central processing module 31 generates the display signal to the direction display areas 232 of the display module 23, so that a left arrow in the direction display areas 232 generates a light source, and a user can clearly know that the position the blocking object 51 in the wall is located on the left side, and then the in-wall feature detection device 1 can be moved in a leftward direction toward the blocking object 51, and the left arrow is only an implementation mode of the direction display areas 232, but the invention is not limited thereto, any display modes that can indicate direction are within the protected scope of the invention. When the position of the blocking object 51 is in an area covered by the display module 23, the central processing module 31 generates the display signal to the shape display areas 231 of the display module 23 to cause the shape display areas 231 to generate an object indicating light source. Alternatively, when a shape of the blocking object 51 in the wall spans multiple sets of the driving modules 41 and the receiving modules 42, the induced electric field generated by the driving modules 41 will be affected by the blocking object 51. The capacitance value conversion module 32 sequentially receives the capacitance values, when the capacitance value received by the capacitance value conversion module 32 changes, the capacitance value sensing signal is generated to the central processing module 31, and the central processing module 31 generates the display signal to the display module 23 at a relative coordinate position according to the capacitance value sensing signal. Thereby, the central processing module 31 is capable of determining a size and a shape of the blocking object 51 through the capacitance value sensing signal, so that a light source generated by the shape display areas 231 is equivalent to the size and the shape of the blocking object 51. Therefore, the in-wall feature detection device 1 is capable of using an electric field change between the driving modules 41 and the receiving modules 42 to determine whether the blocking object 51 is in the wall, and further generating a corresponding light signal through the central processing module 31 to display a shape of the blocking object 51, thereby achieving efficacies of improving a detection resolution and distinctly detecting and displaying the shape of the blocking object 51 in the wall, so as to quickly determining the position and the shape of the blocking object 51 during construction. Contrarily, the self-capacitive technology of the conventional fuzzy feature detector uses the capacitive change of the single electrode to determine the position of the area of the object in the wall, and cannot clearly determine the shape and size of the object.

Figure 9:
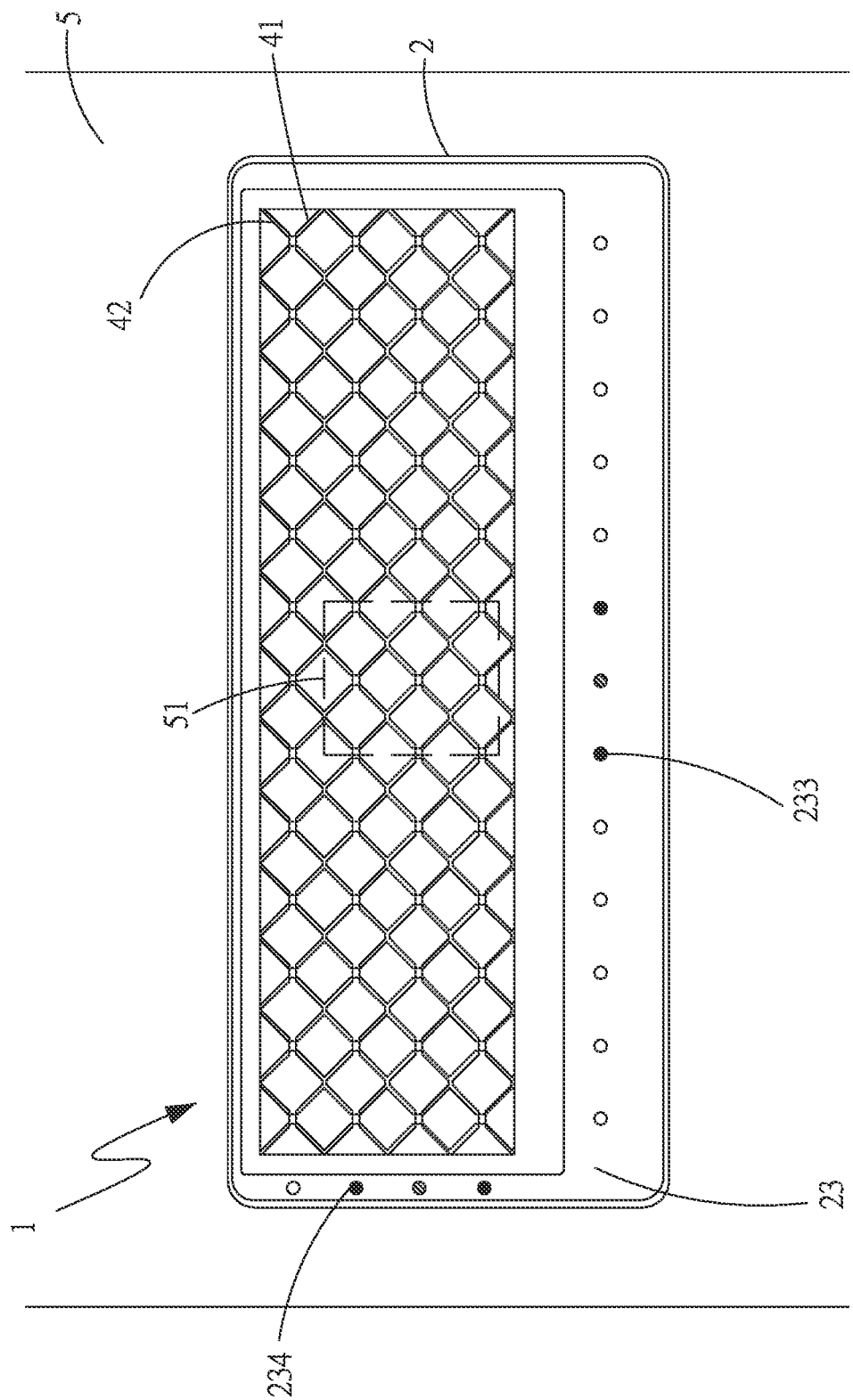
FIG. 9 is another schematic diagram of the in-wall feature detection device of mutual capacitive technology of the invention.

Please refer to the aforementioned figures as well as FIG. 9 for another schematic diagram of the in-wall feature detection device of mutual capacitive technology of the invention, wherein the display module 23 comprises at least one horizontal array LED233 and one vertical array LED234, the central processing module 31 activates the horizontal array LED233 and the vertical array LED234 via the display signal, the central processing module 31 determines a position of the blocking object 51 through the capacitance value sensing signal to drive the corresponding display module 23, and the central processing module 31 determines a center position of the blocking object 51 through the capacitance value sensing signal and activates the corresponding horizontal array LED233 and vertical array LED234 to generate a flickering light source. Thereby, the in-wall feature detection device 1 is capable of using an electric field change between the driving modules 41 and the receiving modules 42 to determine whether the blocking object 51 is in the wall, and further generating a corresponding light signal through the central processing module 31 to display the center position of the blocking object 51, thereby achieving efficacies of improving a detection resolution and distinctly detecting and displaying the shape of the blocking object 51 in the wall, so as to quickly determining the position and the shape of the blocking object 51 during construction.

Figure 10:
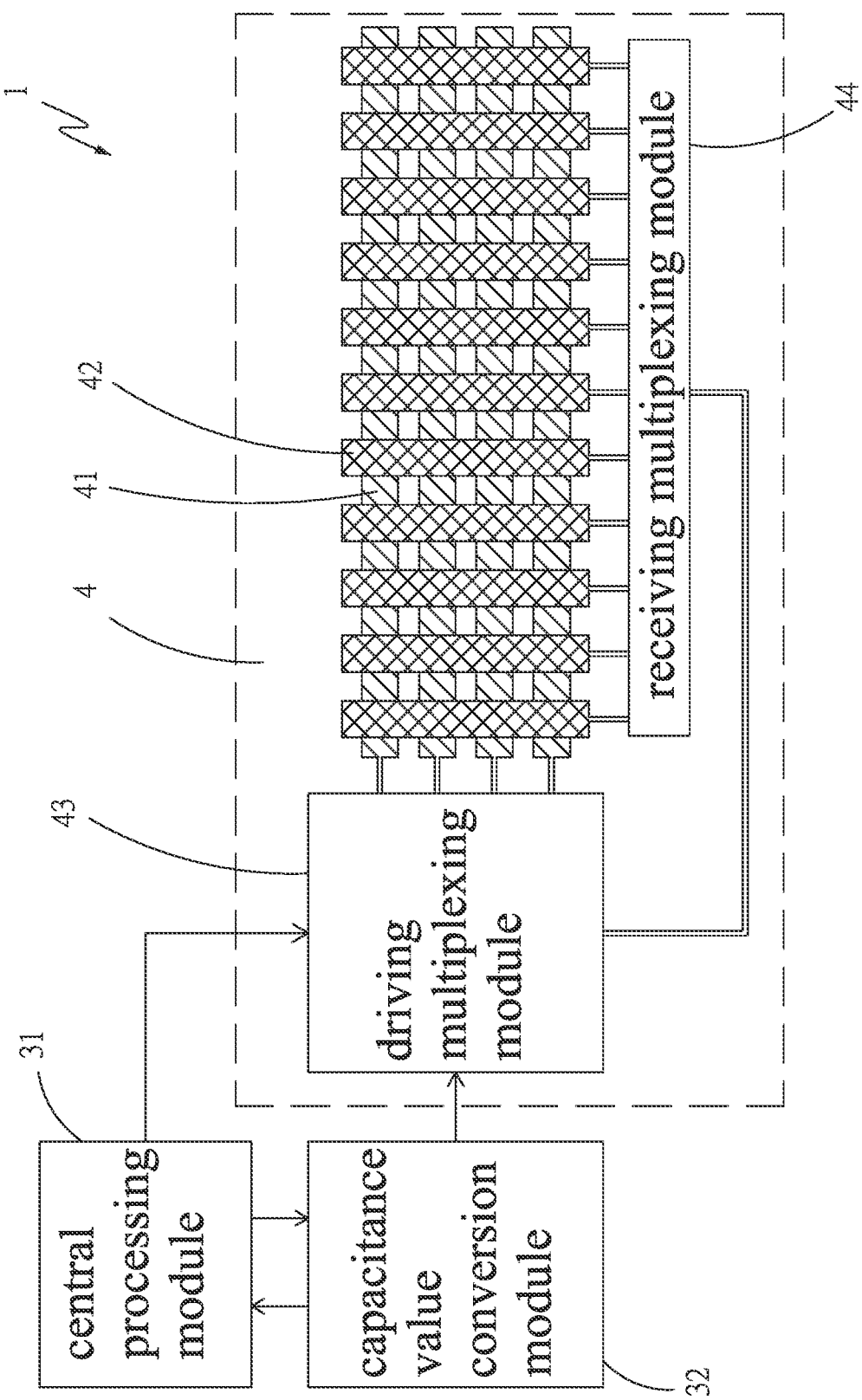
FIG. 10 is another partial schematic diagram of the in-wall feature detection device of mutual capacitive technology of the invention.

Please refer to the aforementioned figures as well as FIG. 10 for another partial schematic diagram of the in-wall feature detection device of mutual capacitive technology of the invention, wherein the capacitive sensing baseplate 4 can be further provided with a receiving multiplexing module 44, the receiving multiplexing module 44 is electrically connected to the capacitance value conversion module 32, the receiving modules 42 are electrically connected to the capacitance value conversion module 32 via the receiving multiplexing module 44, and the capacitance value conversion module 32 sequentially receives the capacitance values through the receiving multiplexing module 44. When the capacitance value received by the capacitance value conversion module 32 changes, the capacitance value sensing signal is generated to the central processing module 31, and the central processing module 31 generates at least one display signal to the display module 23 at a relative coordinate position according to the capacitance value sensing signal. Thereby, the in-wall feature detection device 1 is capable of using an electric field change between the driving modules 41 and the receiving modules 42 to determine whether the blocking object 51 is in the wall, and further generating a corresponding light signal through the central processing module 31 to display the center position of the blocking object 51, thereby achieving efficacies of improving a detection resolution and distinctly detecting and displaying the shape of the blocking object 51 in the wall, so as to quickly determining the position and the shape of the blocking object 51 during construction.

It is to be understood that the above description is only the preferred embodiments of the present invention and is not used to limit the present invention, and changes in accordance with the concepts of the present invention may be made without departing from the spirit of the present invention, for example, the equivalent effects produced by various transformations, variations, modifications and applications made to the configurations or arrangements shall still fall within the scope covered by the appended claims of the present invention.

What is claimed is:

1. An in-wall feature detection device of mutual capacitive technology comprising:
   a housing, the housing being provided with a switch and a power supply module;
   a detection baseplate, the detection baseplate being disposed in the housing and electrically connected to the switch and the power supply module, the detection baseplate being provided with a central processing module and a capacitance value conversion module, and the detection baseplate being electrically connected to at least one display module; and
   at least one capacitive sensing baseplate, the capacitive sensing baseplate being disposed in the housing, the capacitive sensing baseplate being provided with a plurality of driving modules and a plurality of receiving modules, the driving modules and the receiving modules being arranged in a crisscross manner and being electrically connected to the capacitance value conversion module, the central processing module generating at least one activation signal to the capacitance value conversion module, the capacitance value conversion module generating at least one driving signal to be sequentially transmitted to each of the driving modules, each of the driving modules generating at least one induced electric field after being driven and sequentially transmitting the at least one induced electric field to each of the receiving modules, each of the receiving modules receiving the induced electric field and generating a capacitance value, the capacitance value conversion module sequentially receiving the capacitance values and generating at least one capacitance value sensing signal to the central processing module when the received capacitance value changing, and the central processing module generating at least one display signal to the display module according to the capacitance value sensing signal.

2. The in-wall feature detection device of mutual capacitive technology as claimed in claim 1, wherein the driving modules and the receiving modules are disposed on a single capacitive sensing baseplate.

3. The in-wall feature detection device of mutual capacitive technology as claimed in claim 1, wherein the driving modules and the receiving modules are disposed on different capacitive sensing baseplates.

4. The in-wall feature detection device of mutual capacitive technology as claimed in claim 1, wherein the display module is disposed on the housing.

5. The in-wall feature detection device of mutual capacitive technology as claimed in claim 1, wherein the driving module generates the induced electric field to the receiving module after being driven, the capacitance value of the induced electric field between the driving module and the receiving module is changed by at least one blocking object, so that the capacitance value conversion module generates the capacitance value sensing signal to the central processing module, and the central processing module is capable of determining a size and a shape of the blocking object through the capacitance value sensing signal.

6. The in-wall feature detection device of mutual capacitive technology as claimed in claim 5, wherein the display module is an LCD, the display module is formed with a plurality of shape display areas and a plurality of direction display areas, and the central processing module activates the shape display areas to generate an object indicating light source via the display signal, and can also activate the direction display areas to generate an object direction indicating light source via the display signal.

7. The in-wall feature detection device of mutual capacitive technology as claimed in claim 5, wherein the display module comprises at least one horizontal array LED and one vertical array LED, the central processing module activates the horizontal array LED and the vertical array LED via the display signal, and the central processing module determines a center position of the blocking object through the capacitance value sensing signal and activates the corresponding horizontal array LED and vertical array LED to generate a flickering light source.

8. The in-wall feature detection device of mutual capacitive technology as claimed in claim 1, wherein the capacitive sensing baseplate is further provided with a driving multiplexing module, wherein the driving multiplexing module is electrically connected to the central processing module and the capacitance value conversion module, and the driving modules are electrically connected to the capacitance value conversion module via the driving multiplexing module.

9. The in-wall feature detection device of mutual capacitive technology as claimed in claim 8, wherein the capacitance value conversion module sequentially transmits the driving signals to each of the driving modules through the driving multiplexing module, each of the driving modules generates the induced electric field to be sequentially transmitted to each of the receiving modules, and each of the receiving modules receives the induced electric field and generates the capacitance value.

10. The in-wall feature detection device of mutual capacitive technology as claimed in claim 1, wherein the capacitive sensing baseplate is further provided with a receiving multiplexing module electrically connected to the capacitance value conversion module, the receiving modules are electrically connected to the capacitance value conversion module via the receiving multiplexing module, and the capacitance value conversion module sequentially receives the capacitance values through the receiving multiplexing module.

* * * * *